(12) United States Patent
Lin et al.

(10) Patent No.: US 9,466,635 B2
(45) Date of Patent: Oct. 11, 2016

(54) WIDE DYNAMIC RANGE PIXEL CIRCUIT

(71) Applicant: Himax Imaging Limited, Tainan (TW)

(72) Inventors: Dong-Long Lin, Tainan (TW); Chung-Ren Li, Tainan (TW); Chung-Wei Chang, Tainan (TW)

(73) Assignee: Himax Imaging Limited, Tainan (TW)

( * ) Notice: Subject to any disclaimer, the term of this patent is extended or adjusted under 35 U.S.C. 154(b) by 107 days.

(21) Appl. No.: 14/207,669

(22) Filed: Mar. 13, 2014

(65) Prior Publication Data
US 2015/0200217 A1 Jul. 16, 2015

(30) Foreign Application Priority Data

Jan. 10, 2014 (TW) .............................. 103101062 A

(51) Int. Cl.
| | | |
|---|---|---|
| H01L 31/062 | (2012.01) | |
| H01L 27/146 | (2006.01) | |
| H04N 5/355 | (2011.01) | |
| H04N 5/3745 | (2011.01) | |

(52) U.S. Cl.
CPC ... *H01L 27/14643* (2013.01); *H01L 27/14609* (2013.01); *H01L 27/14665* (2013.01); *H04N 5/35518* (2013.01); *H04N 5/3745* (2013.01)

(58) Field of Classification Search
CPC .................. H01L 27/14609; H01L 27/14643; H01L 27/14665
USPC .......................................... 257/290–293, 443
See application file for complete search history.

(56) References Cited

U.S. PATENT DOCUMENTS

| | | | |
|---|---|---|---|
| 5,742,047 A | 4/1998 | Buhler | |
| 6,323,479 B1 | 11/2001 | Hynecek | |
| 6,545,710 B1 * | 4/2003 | Kubo | H04N 9/735 |
| | | | 348/223.1 |
| 7,119,320 B2 | 10/2006 | Sartori | |
| 7,224,391 B2 * | 5/2007 | Kimura | H04N 5/374 |
| | | | 250/208.1 |
| 7,235,771 B2 | 6/2007 | Pain | |
| 2002/0021121 A1 * | 2/2002 | Nakamura | H01L 27/14609 |
| | | | 324/96 |
| 2003/0234344 A1 | 12/2003 | Lai | |
| 2003/0234345 A1 | 12/2003 | Tecchiolli | |
| 2004/0065804 A1 * | 4/2004 | Kusuda | H04N 5/335 |
| | | | 250/208.1 |
| 2009/0163784 A1 * | 6/2009 | Sarpeshkar | A61B 5/14551 |
| | | | 600/322 |
| 2010/0224765 A1 | 9/2010 | Seitz | |
| 2014/0293102 A1 * | 10/2014 | Vogelsang | H04N 5/3535 |
| | | | 348/294 |

FOREIGN PATENT DOCUMENTS

| | | |
|---|---|---|
| TW | 536821 | 6/2003 |
| TW | 200917827 | 4/2009 |
| WO | 2009136285 A2 | 11/2009 |

OTHER PUBLICATIONS

G. Storm, et al., "Extended Dynamic Range From a Combined Linear-Logarithmic CMOS Image Sensor," IEEE Journal of Solid-State Circuits, vol. 41, No. 9, pp. 2095-2097, IEEE, Sep. 2006.

* cited by examiner

*Primary Examiner* — Matthew E Warren
(74) *Attorney, Agent, or Firm* — Winston Hsu; Scott Margo

(57) ABSTRACT

A pixel circuit includes: a photodetector, a signal adjustment circuit and a switch circuit. The photodetector is employed for generating an output signal in response to light that is incident thereon. The signal adjustment circuit is coupled to the photodetector, and employed for selectively adjusting the output signal to allow the output signal to have a plurality of different logarithmic functions in respect to an intensity of the light. The switch circuit is coupled to the signal adjustment circuit and the photodetector, and employed for coupling the photodetector to the signal adjustment circuit.

18 Claims, 6 Drawing Sheets

WIDE DYNAMIC RANGE PIXEL CIRCUIT

BACKGROUND OF THE INVENTION

1. Field of the Invention

The present invention relates, generally, to an image sensor, and, more particularly, to an image sensor and a pixel circuit thereof that has a wide dynamic range due to logarithmic-linear-logarithmic operation.

2. Description of the Prior Art

Complementary metal-oxide-semiconductor (CMOS) image sensors are widely used in a variety of commercial applications. The major advantages of CMOS image sensors are high level of integration, low voltage operation and low production cost. However, CMOS image sensors usually have poor dynamic range when compared to a charge-coupled device (CCD) image sensors.

There are several ways to improve the dynamic range of a CMOS image sensor, one of which is logarithmic pixel. It is widely used in a three-transistor (3T) Photodiode pixel for some applications. Generally, an active or passive pixel responds linearly to the light intensity that enters the pixel. A logarithmic pixel is based on the sub-threshold operation mode of a MOS transistor to provide a logarithmic number of electrons into the photodiode when the photocurrent is so small that the transistor enters the sub-threshold region. However, such operation leads to following disadvantages:

1. Low photosensitivity especially in the low illumination region;
2. Slow response due to sub-threshold operation; and
3. A relatively large variation of the device characteristics due to sub-threshold operation.

Therefore, there is still a need to provide a pixel circuit and an image sensor that can overcome the above-mentioned disadvantages.

SUMMARY OF THE INVENTION

With this in mind, it is one objective of the present invention to provide a pixel circuit and an image sensor having a wide dynamic range. The inventive pixel circuit has a logarithmic-linear-logarithmic operation in different illumination conditions.

According to one exemplary embodiment, a pixel circuit is provided, which comprises: a photodetector, a signal adjustment circuit and a switch circuit. The photodetector is employed for generating a output signal in response to light that is incident thereon. The signal adjustment circuit is coupled to the photodetector, and employed for selectively adjusting the output signal to allow the output signal to have a plurality of different logarithmic functions in respect to an intensity of the light. The switch circuit is coupled to the signal adjustment circuit and the photodetector, and employed for coupling the photodetector to the signal adjustment circuit.

According to one exemplary embodiment, an image sensor is provided, which comprises: an array of pixel circuits. Each of pixel circuit comprises: a photodetector, a signal adjustment circuit and a switch circuit. The photodetector is employed for generating a output signal in response to light that is incident thereon. The signal adjustment circuit is coupled to the photodetector, and employed for selectively adjusting the output signal to allow the output signal to have a plurality of different logarithmic functions in respect to an intensity of the light. The switch circuit is coupled to the signal adjustment circuit and the photodetector, and employed for coupling the photodetector to the signal adjustment circuit.

Above-mentioned embodiments provide a pixel circuit and an image sensor have logarithmic operations in a low illumination condition or in a high illumination condition. In addition, the pixel circuit and the image sensor have a linear operation in a moderate illumination condition such that the pixel circuit and the image sensor can have a wide dynamic range and a fast response compared to a log pixel or a linear pixel.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
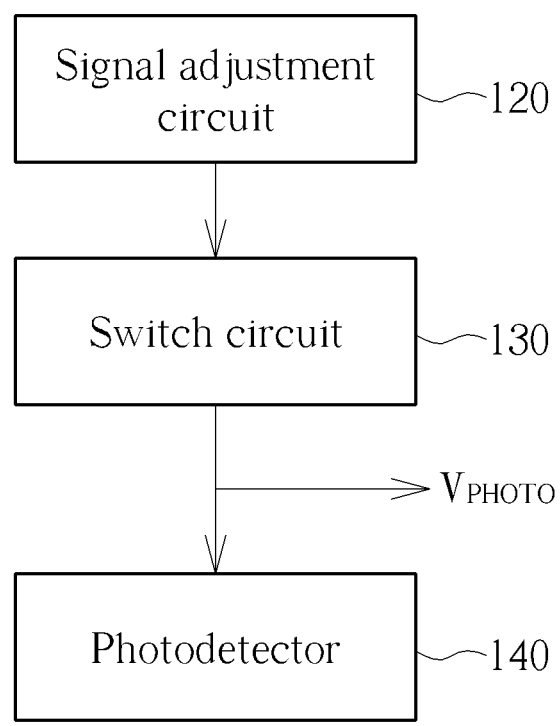
FIG. 1 is a simplified diagram of a pixel circuit according to one exemplary embodiment of the present invention.

With reference to FIG. 1, a simplified diagram of a pixel circuit according to one exemplary embodiment is depicted. As depicted in FIG. 1, the pixel circuit comprises a photodetector 110, a signal adjustment circuit 120 and a switch circuit 130. The photodetector 110, preferably a photodiode (but not limited to, which may be a phototransistor), is employed for generating an output signal $V_{PHOTO}$ in response to light that is incident thereon. The signal adjustment circuit 120 is coupled to the photodetector 110, and utilized for selectively adjusting the output signal $V_{PHOTO}$ to allow the output signal $V_{PHOTO}$ to have a plurality of different logarithmic functions in respect to an intensity of the light. The signal adjustment circuit 120 may be operated in a sub-threshold region, which allows the output signal $V_{PHOTO}$ to be the logarithmic function in respect to the intensity of the light if the switch circuit 130 is conductive. The switch circuit 130 is coupled to the signal adjustment circuit 120 and the photodetector 110 is utilized for coupling the photodetector 110 to the signal adjustment circuit 120. When the switch circuit 130 operates to couple the signal adjustment circuit 120 to the photodetector 110, the output signal $V_{PHOTO}$ will have the logarithmic function in respect to the intensity of the light. Otherwise, the output signal $V_{PHOTO}$ will have a linear function in respect to the intensity of the light.

Figure 2:
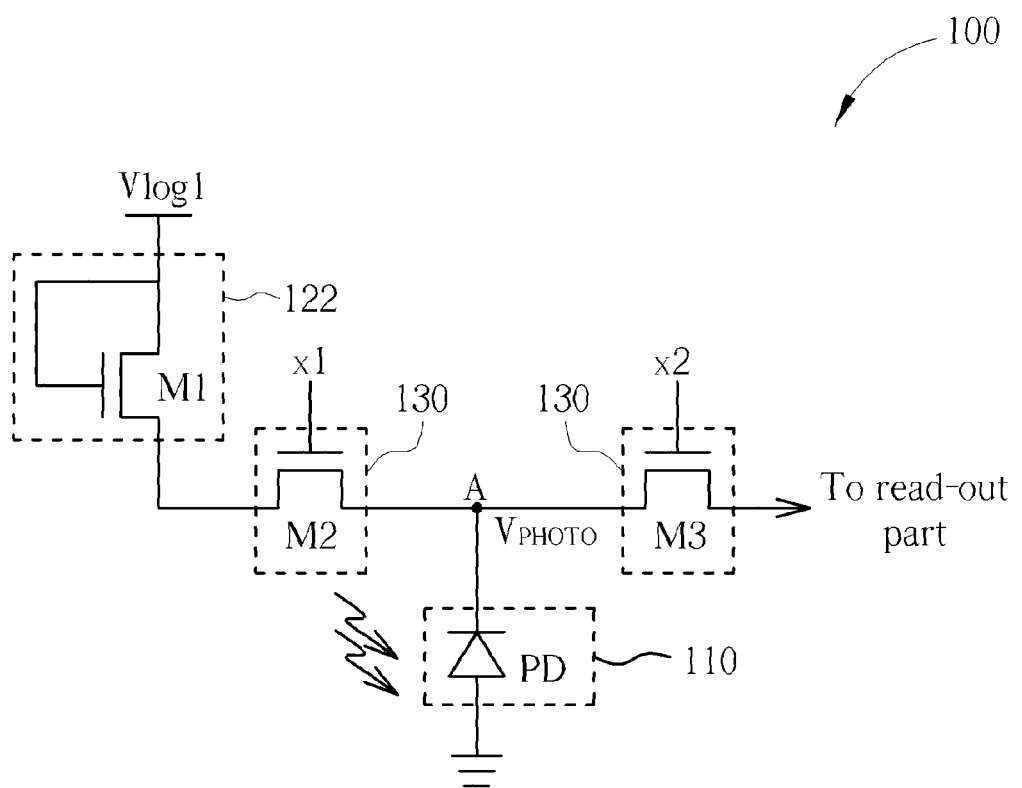
FIG. 2 is a circuit diagram of a pixel circuit according to one exemplary embodiment of the present invention.

FIG. 2 depicts a detailed circuit diagram of a pixel circuit 100 according to one exemplary embodiment of the present invention. The signal adjustment circuit 120 comprises a first signal adjustment component 122, which preferably includes a diode-connected transistor M1, and is coupled to the photodetector 110 (which comprises a photodiode PD) via the switch circuit 130 which comprises a first switching element M2 controlled by a control signal x1. When the control signal x1 allows the first switching element M2 to be conductive, the first signal adjustment component 122 will adjust the output signal $V_{PHOTO}$, making the output signal $V_{PHOTO}$ to have a first logarithmic function in respect to the intensity of the light. A predetermined voltage Vlog1 is coupled to one specific electrode and one control electrode of the diode-connected transistor M1. The predetermined voltage Vlog1 determines the characteristics of the first logarithmic function of the output signal $V_{PHOTO}$ caused by the diode-connected transistor M1 and when the diode-connected transistor M1 operates in a sub-threshold region to make the output signal $V_{PHOTO}$ have the first logarithmic function. When the switch circuit 130 couples to the diode-connected transistor M1 to the photodetector 110, and the diode-connected transistor M1 starts to operate in the sub-threshold region, charges will be provided by the diode-connected transistor M1 to increase the current flowing into the node A. In this regards, the pixel circuit 100 acts as a log pixel. The output signal $V_{PHOTO}$ drops more largely than a linear pixel, providing stronger luminance information. When the voltage of node A drops below a certain level, the diode-connected transistor M1 will be turned off, and the output signal $V_{PHOTO}$ will therefore have a linear function in respect to the intensity of the light. Meanwhile, the first switching element M2 is not conductive by pulling down the control signal x1 and the pixel circuit 100 acts as a linear pixel.

By properly setting the predetermined voltage Vlog1, it is also available that the diode-connected transistor M1 operates to restrain the output signal $V_{PHOTO}$ to prevent from being saturated. In a high illumination condition, the output signal $V_{PHOTO}$ may be saturated. Under such condition, the first switching element M2 couples to the diode-connected transistor M1 to the photodetector 110, the diode-connected transistor M1 operates in the sub-threshold region, providing a sub-threshold current which is much smaller than a high photocurrent generated by the photodiode PD due to high illumination such that the drop of the output signal $V_{PHOTO}$ can be restrained. As a result, the output signal $V_{PHOTO}$ will not be saturated.

The switch circuit 130 may include an optional component, second switching element M3 controlled by a control signal x2. The second switching element M3 allows the output signal $V_{PHOTO}$ to be read out by a readout part of the pixel circuit 100. The switching element M3 is able to prevent the output signal $V_{PHOTO}$ from being interfered with noises during an integration period of the pixel circuit 100. When the integration period ends, the second switching element M3 is conductive and the readout part can derive the output signal $V_{PHOTO}$.

Figure 3:
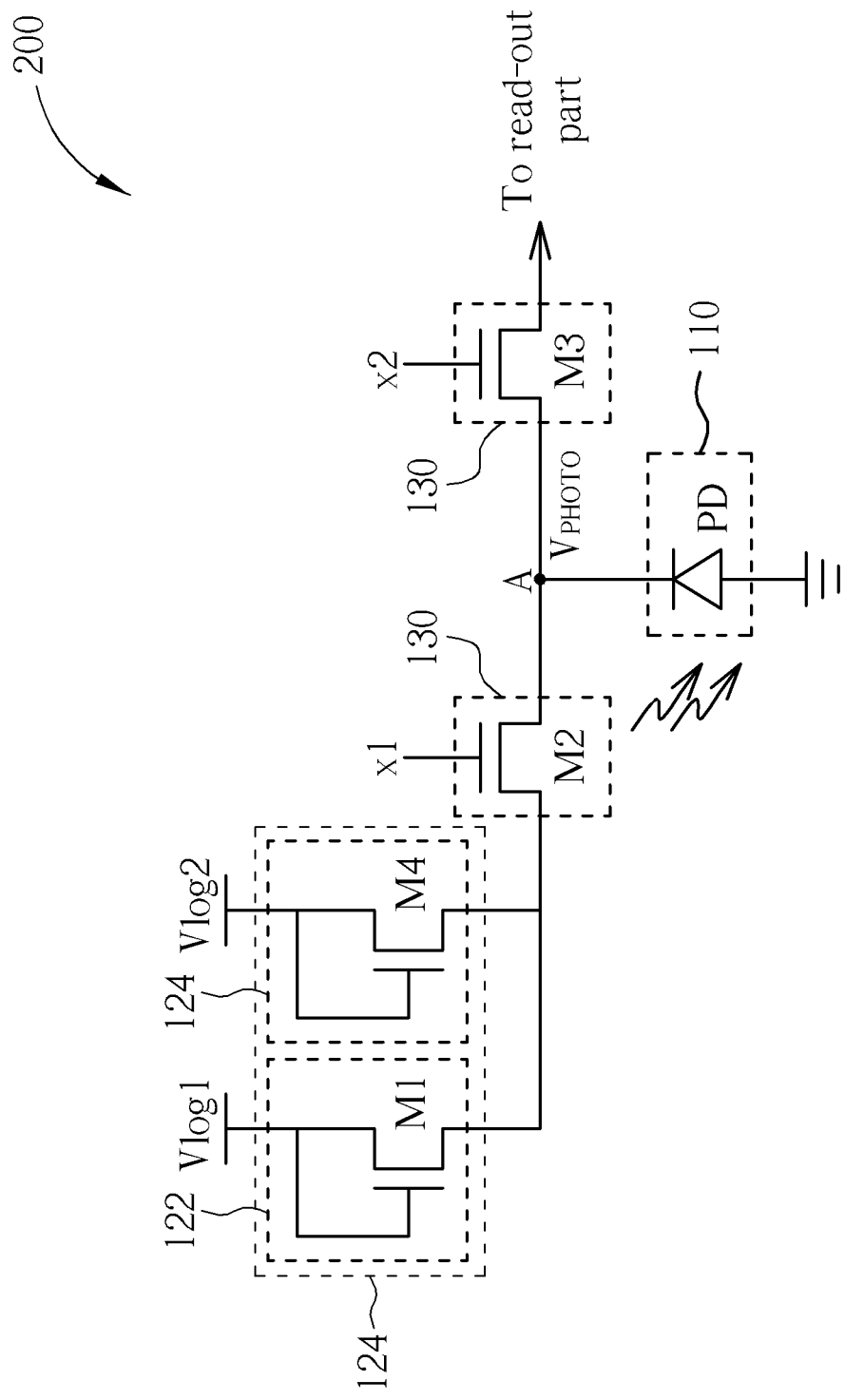
FIG. 3 is a circuit diagram of a pixel circuit according to another exemplary embodiment of the present invention.

FIG. 3 depicts a detailed circuit diagram of the pixel circuit according to another exemplary embodiment of the present invention. In this embodiment, the signal adjustment circuit 120 comprises a first signal adjustment component 122 as well as a second signal adjustment component 124. Preferably, the first signal adjustment component 122 includes a diode-connected transistor M1 while the second signal adjustment component 124 includes a transistor M4. Both of the transistors M1 and M4 are coupled to the photodetector 110 (which comprises a photodiode PD) via the switch circuit 130 which comprises a first switching element M2 controlled by a control signal x1. When the control signal x1 allows the first switching element M2 to be conductive, the first signal adjustment component 122 and the first signal adjustment component 124 will adjust the output signal $V_{PHOTO}$, making the output signal $V_{PHOTO}$ to have one or more logarithmic function in respect to the intensity of the light.

Both of the transistors M1 and M4 have one electrode being coupled to predetermined voltages Vlog1 and Vlog2, respectively. In case of the voltage Vlog1 identical to voltage Vlog2, both of the transistors M1 and M4 can provide charges to increase the current flowing into the node A, thereby to enhance the drop of the output signal $V_{PHOTO}$. The predetermined voltage Vlog1 as well as Vlog2 determines the characteristics of the first logarithmic function of the output signal $V_{PHOTO}$ and when the diode-connected transistor M1 and the transistor M4 operate in the sub-threshold region to make the output signal $V_{PHOTO}$ have the first logarithmic function. If the voltage Vlog1 is different from the voltage Vlog2, one of the transistors M1 and M4 may be used to enhance the drop of the output signal $V_{PHOTO}$ while other is used to restrain the drop of the of the output signal $V_{PHOTO}$. Such configuration can therefore improve the dynamic range of the pixel circuit 200. The transistor M1 may make the output signal $V_{PHOTO}$ have a first logarithmic function in respect to the intensity of the light while the transistor M4 may make the output signal $V_{PHOTO}$ have a second logarithmic function in respect to the intensity. The characteristics of a second logarithmic function are determined by the predetermined voltage Vlog2. This could be useful in a scene having complicated lightings. The pixel circuit 200 has better responses than a linear pixel in low illumination condition and in a high illumination condition due to the first logarithmic function and the second logarithmic function of the output signal $V_{PHOTO}$. If the illumination is moderate, the pixel circuit 200 will have a linear function by cutting off the control signal x1 of the first switching element M2. The period during which the transistors M1 operates in the sub-threshold region and the period during which the transistors M4 operates in the sub-threshold region may be partially overlapped or not overlapped, which depends on the selection of the predetermined voltages Vlog1 and Vlog2.

Similarly, the switch circuit 130 may include an optional component, second switching element M3 controlled by a control signal x2. The second switching element M3 allows the output signal $V_{PHOTO}$ to be read out by a readout part of the pixel circuit 100. The switching element M3 is able to prevent the output signal $V_{PHOTO}$ from being interfered with noises during an integration period of the pixel circuit 100. When the integration period ends, the second switching element M3 is conductive and the readout part can derive the output signal $V_{PHOTO}$.

Figure 4:
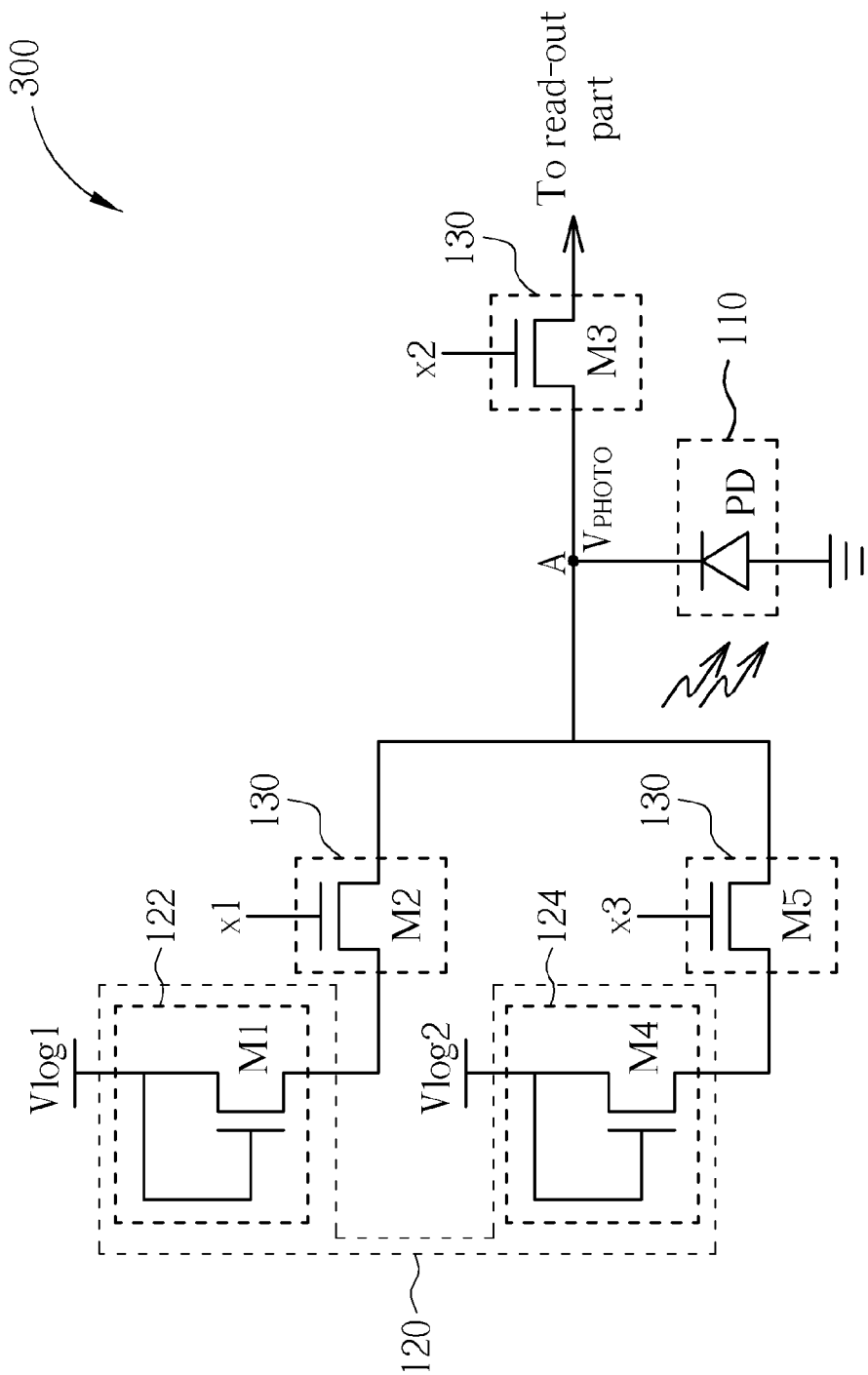
FIG. 4 is a circuit diagram of a pixel circuit according to still another exemplary embodiment of the present invention.

In one exemplary embodiment, the switching circuit 130 further comprises a third switching element M5. This is illustrated by a pixel circuit 300 as shown in FIG. 4. The third switching element M5 is coupled between the photodetector 110 and the signal adjustment circuit 120, which is controlled by a control signal x3. When the control signal x3 allows the third switching element M5 to be conductive, the second signal adjustment component 124 will adjust the output signal $V_{PHOTO}$, making the output signal $V_{PHOTO}$ to have the logarithmic function in respect to the intensity of the light. In this exemplary embodiment, the first signal adjustment component 122 and the second signal adjustment component 124 are coupled to the photodetector 110 via different switching elements.

Figure 5:
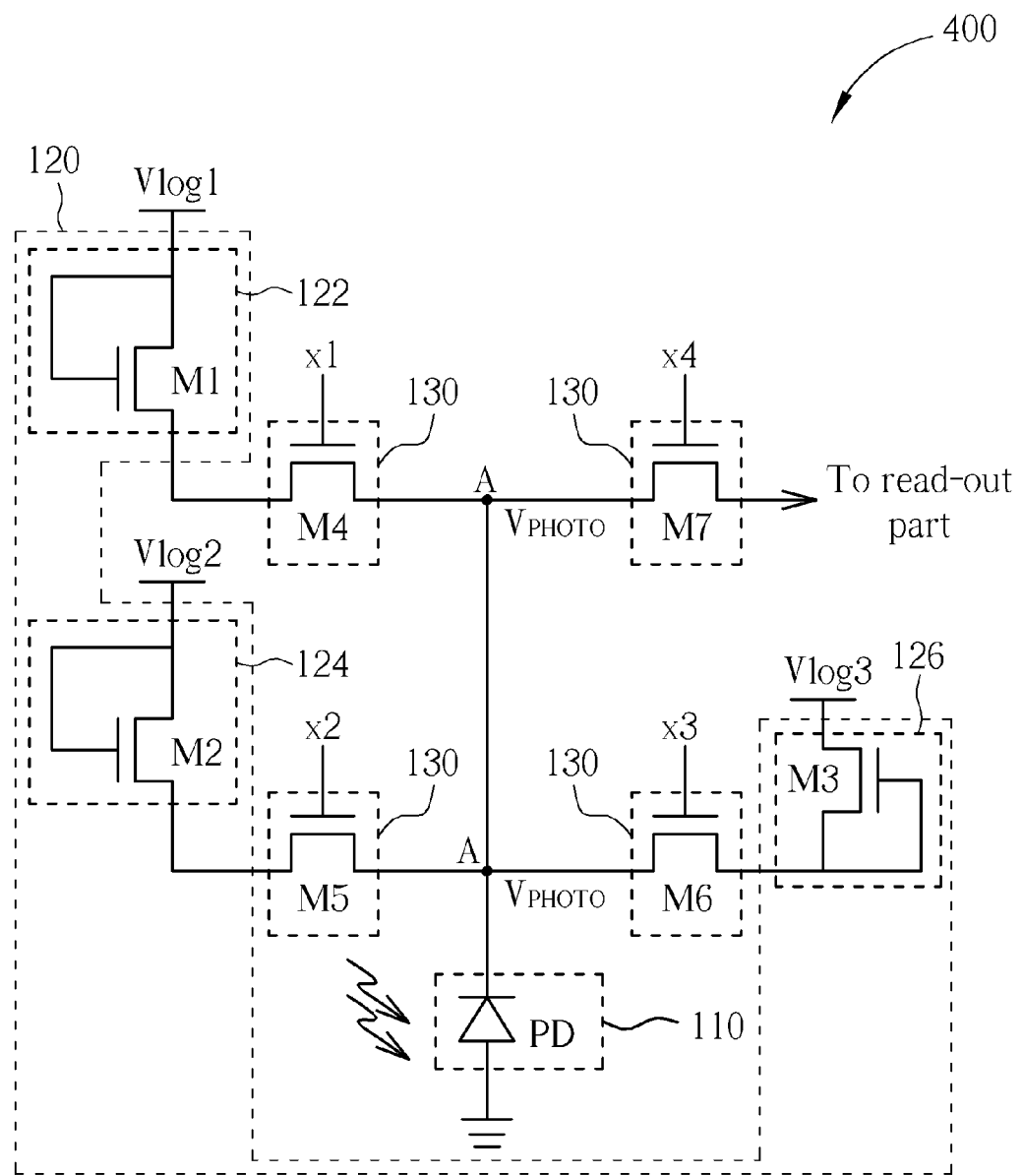
FIG. 5 is a circuit diagram of a pixel circuit according to yet another exemplary embodiment of the present invention.

To further improve the response of the pixel circuit in a complicated lighting environment, the signal adjustment circuit 120 may comprises a plurality of signal adjustment components such that the enhancement or the restraining of the drop of the output signal $V_{PHOTO}$ can be improved. Please refer to FIG. 5, which depicts a detailed circuit diagram of a pixel circuit 400 according to one exemplary embodiment of the present invention. In this exemplary embodiment, the pixel circuit 400 has a first signal adjustment component M1 and two second signal adjustment components M2 and M3. Therefore, the output signal $V_{PHOTO}$ can be adjusted to have a plurality of logarithmic functions in respect to the intensity of the light according to the predetermined voltages Vlog1, Vlog2 and Vlog3, respectively. The first signal adjustment component M1 is coupled to the photodetector 110 via the switching element M4 controlled by the signal x1, the second signal adjustment component M2 is coupled to the photodetector 110 via the switching element M5 controlled by the signal x2, and the third signal adjustment component M3 is coupled to the photodetector 110 via the switching element M6 controlled by the signal x3. The switching element M4 controlled by the signal x4 is responsible for allowing the signal to be read out. Depending on the value of the predetermined voltages Vlog1, Vlog2, and Vlog3, the output signal $V_{PHOTO}$ will have different logarithmic functions under different illumination condition such that the drop of the output signal $V_{PHOTO}$ can be enhanced in a low illumination condition or be restrained in a high illumination condition. Therefore, the pixel circuit 400 has a very wide dynamic range.

Figure 6:
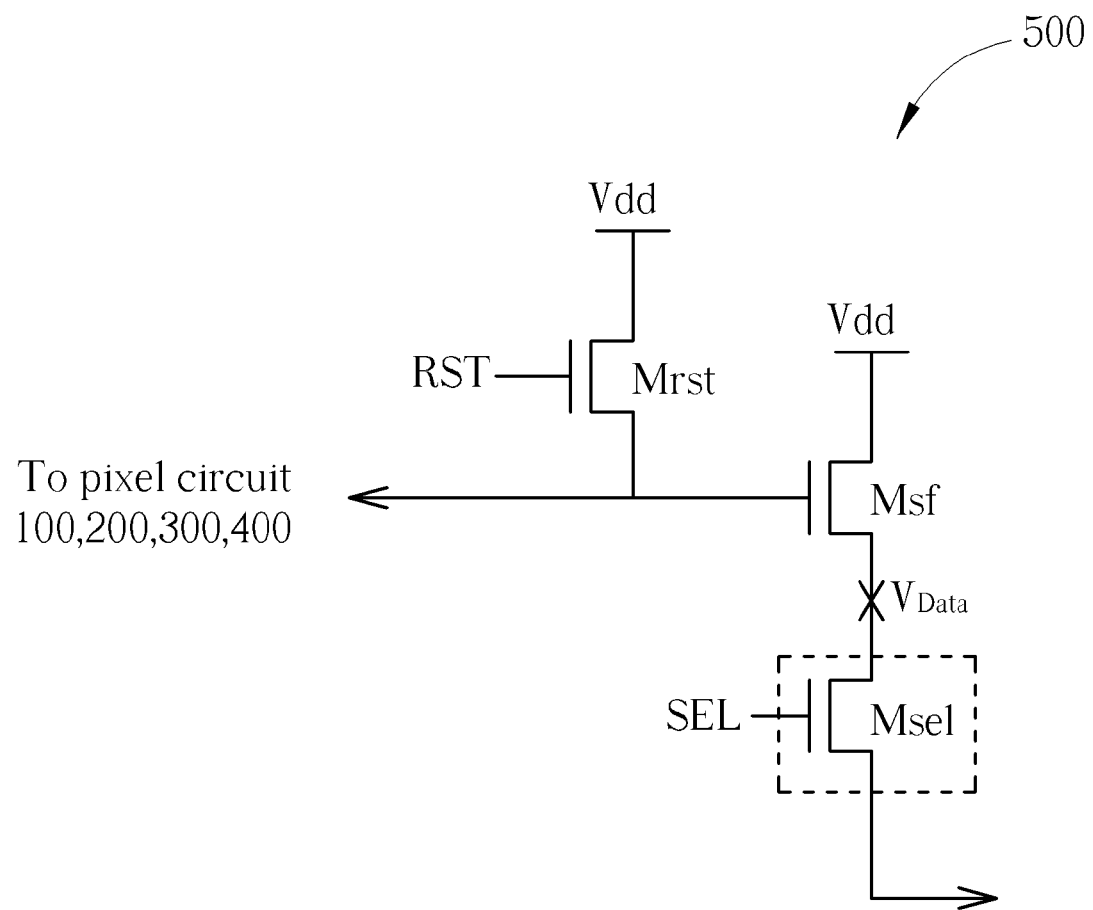
FIG. 6 is a circuit diagram of a readout part according to one exemplary embodiment of the present invention.

In order to read out the output signal $V_{PHOTO}$, the pixel circuits as mentioned above further comprise a readout part which may include reset transistor and a source follower. Please refer to FIG. 6, which illustrated a readout part according to one exemplary embodiment of the present invention. As shown in FIG. 6, a readout part 500 includes a reset transistor $M_{rst}$ and a source follower $M_{sf}$. The reset transistor $M_{rst}$ has a first electrode coupled to the photodetector 110, a second electrode coupled to a supply voltage Vdd, and a control electrode coupled to a reset control signal RST. The source follower $M_{sf}$ has a control electrode coupled to the photodetector 110, and is employed for generating a pixel data output $V_{Data}$ according to the output signal $V_{PHOTO}$. Additionally, the readout part 500 may further comprise a selecting circuit $M_{sel}$ which is coupled to the source follower $M_{sf}$, and utilized for transferring the pixel data output $V_{Data}$ during a read-out period of the pixel circuit (e.g. pixel circuits 100-400). Please note that only one of the selecting circuit $M_{sel}$ and the second switching element (e.g. M3 of the pixel circuits 100, 200, and 300, or M7 of the pixel circuit 400) is necessary. Depending on different requirement, it is possible that embodiments of the present invention include either both of the selecting circuit $M_{sel}$ and the second switching element or only one of the selecting circuit $M_{sel}$ and the second switching element. Operations and principles thereof are well known to those skilled in the art. Therefore, detailed descriptions regarding the above-mentioned components are omitted here for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel circuit, comprising:
   a photodetector, for generating a output signal at a terminal of the photodetector in response to light that is incident thereon;
   a signal adjustment circuit, coupled to the photodetector, for selectively adjusting the output signal to allow the output signal to have a plurality of different logarithmic functions in respect to an intensity of the light, comprising:
      a first signal adjustment component, coupled to the photodetector via the switch circuit, for adjusting the output signal to allow the output signal to have a first function of the logarithmic functions in respect to the intensity of the light according to a first predetermined voltage coupled thereto when the first signal adjustment component is coupled to the photodetector; and
      a second signal adjustment component, coupled to the photodetector via the switch circuit, for adjusting the output signal according to a second predetermined voltage when the switch circuit couples the second signal adjustment element to the photodetector, wherein the second predetermined voltage is different from the first predetermined voltage, and the first signal adjustment component allows the output signal to have the first function of the logarithmic functions in respect to the intensity of the light and the second signal adjustment component allows the output signal to have a second function of the logarithmic functions in respect to the intensity of the light; and
   a switch circuit, coupled to the signal adjustment circuit and the photodetector, for coupling the photodetector to the signal adjustment circuit, comprising:
      a first switching element, for coupling the first signal adjustment component to the photodetector.

2. The pixel circuit of claim 1, wherein the first signal adjustment component comprises:
   a first transistor, being a diode-connected transistor, having a first electrode being coupled to the first switching element, a second electrode and a control electrode being coupled together to the first predetermined voltage.

3. The pixel circuit of claim 1, wherein the second signal adjustment comprises:
   a second transistor, having a first electrode and a control electrode being coupled together to the firs switching element, a second electrode being coupled to the second predetermined voltage.

4. The pixel circuit of claim 1, wherein the switch circuit further comprises:
   a second switching element, coupled between the photodetector and the signal adjustment circuit, for coupling the second signal adjustment component to the photodetector.

5. The pixel circuit of claim 1, wherein the signal adjustment circuit further comprises:
   a plurality of second signal adjustment components, coupled to the photodector via the switch circuit, for adjusting the output signal to have a plurality of second functions of the logarithmic functions in respect to the intensity of the light according to a plurality of second predetermined voltages, respectively; and
   the switch circuit comprises:
      a plurality of second switching elements, coupled between the second signal adjustment components and the photodetector, respectively.

6. The pixel circuit of claim 5, wherein each of the second signal adjustment components comprises:
   a second transistor, having a first electrode and a control electrode being coupled together to the second switching element, a second electrode being coupled to the second predetermined voltage.

7. The pixel circuit of claim 1, wherein the pixel circuit further comprises:
a reset transistor, having a first electrode being coupled to the photodetector, a second electrode being coupled to a supply voltage, a control electrode being coupled to a reset control signal; and
a source follower, having a control electrode coupled to the photodetector, for generating a pixel data output according to the output signal.

8. The pixel circuit of claim 7, wherein the switch circuit comprises:
a third switching element, coupled between the photodetector and the source follower, for coupling the photodetector to the source follower during a read-out period of the pixel circuit.

9. The pixel circuit of claim 7, wherein the pixel circuit comprises:
a selecting circuit, coupled to the source follower, for transferring the pixel data output during a read-out period of the pixel circuit.

10. An image sensor, comprising:
an array of pixel circuits, each comprising:
a photodetector, for generating a output signal at a terminal of the photodetector in response to light that is incident thereon;
a signal adjustment circuit, coupled to the photodetector, for selectively adjusting the output signal to allow the output signal to have a plurality of different logarithmic functions in respect to an intensity of the light, comprising:
a first signal adjustment component, coupled to the photodetector via the switch circuit, for adjusting the output signal to allow the output signal to have a first function of the logarithmic functions in respect to the intensity of the light according to a first predetermined voltage coupled thereto when the first signal adjustment component is coupled to the photodetector; and
a second signal adjustment component, coupled to the photodetector via the switch circuit, for adjusting the output signal according to a second predetermined voltage when the switch circuit couples the second signal adjustment element to the photodetector, wherein the second predetermined voltage is different from the first predetermined voltage, and the first signal adjustment component allows the output signal to have the first function of the logarithmic functions in respect to the intensity of the light and the second signal adjustment component allows the output signal to have a second function of the logarithmic functions in respect to the intensity of the light; and
a switch circuit, coupled to the signal adjustment circuit and the photodetector, for coupling the photodetector to the signal adjustment circuit, comprising:
a first switching element, for coupling the first signal adjustment component to the photodetector.

11. The image sensor of claim 10, wherein the first signal adjustment components comprises:
a first transistor, being a diode-connected transistor, having a first electrode being coupled to the first switching element, a second electrode and a control electrode being coupled together to the first predetermined voltage.

12. The image sensor of claim 10, wherein the second signal adjustment comprises:
a second transistor, having a first electrode and a control electrode being coupled together to the firs switching element, a second electrode being coupled to the second predetermined voltage.

13. The image sensor of claim 10, wherein the switch circuit further comprises:
a second switching element, coupled between the photodetector and the signal adjustment circuit, for coupling the second signal adjustment component to the photodetector.

14. The image sensor of claim 10, wherein the signal adjustment circuit further comprises:
a plurality of second signal adjustment components, coupled to the photodector via the switch circuit, for adjusting the output signal to have a plurality of second functions of the logarithmic functions in respect to the intensity of the light according to a plurality of second predetermined voltages, respectively; and
the switch circuit comprises:
a plurality of second switching elements, coupled between the second signal adjustment components and the photodetector, respectively.

15. The image sensor of claim 14, wherein each of the second signal adjustment components comprises:
a second transistor, having a first electrode and a control electrode being coupled together to the second switching element, a second electrode being coupled to the second predetermined voltage.

16. The image sensor of claim 10, wherein the pixel circuit further comprises:
a reset transistor, having a first electrode being coupled to the photodetector, a second electrode being coupled to a supply voltage, a control electrode being coupled to a reset control signal; and
a source follower, having a control electrode coupled to the photodetector, for generating a pixel data output according to the output signal.

17. The image sensor of claim 16, wherein the switch circuit comprises:
a third switching element, coupled between the photodetector and the source follower, for coupling the photodetector to the source follower during a read-out period of the pixel circuit.

18. The image sensor of claim 16, wherein the pixel circuit comprises:
a selecting circuit, coupled to the source follower, for transferring the pixel data output during a read-out period of the pixel circuit.

* * * * *